United States Patent
Brencher et al.

(10) Patent No.: US 9,305,798 B2
(45) Date of Patent: Apr. 5, 2016

(54) DEVICE AND METHOD FOR STOPPING ETCHING PROCESS

(71) Applicant: Infineon Technologies AG, Neubiberg (DE)

(72) Inventors: Lothar Brencher, Radeberg (DE); Dirk Meinhold, Dresden (DE); Michael Hartenberger, Dresden (DE); Georg Seidemann, Landshut (DE); Wolfgang Dickenscheid, Dresden (DE)

(73) Assignee: Infineon Technologies AG, Neubiberg (DE)

(*) Notice: Subject to any disclaimer, the term of this patent is extended or adjusted under 35 U.S.C. 154(b) by 39 days.

(21) Appl. No.: 13/850,206

(22) Filed: Mar. 25, 2013

(65) Prior Publication Data

US 2013/0288481 A1 Oct. 31, 2013

Related U.S. Application Data

(62) Division of application No. 11/937,681, filed on Nov. 9, 2007, now Pat. No. 8,404,597.

(51) Int. Cl.
| | |
|---|---|
| *H01L 21/461* | (2006.01) |
| *H01L 21/308* | (2006.01) |
| *H01L 21/3213* | (2006.01) |
| *H01L 21/311* | (2006.01) |
| *H01L 21/768* | (2006.01) |

(52) U.S. Cl.
CPC ...... *H01L 21/3083* (2013.01); *H01L 21/31116* (2013.01); *H01L 21/32136* (2013.01); *H01L 21/76802* (2013.01)

(58) Field of Classification Search
CPC ............ H01L 21/31116; H01L 21/32136; H01L 21/32137
USPC ............. 438/717, 720, 724, 742; 216/49, 69
See application file for complete search history.

(56) References Cited

U.S. PATENT DOCUMENTS

| | | | | |
|---|---|---|---|---|
| 5,610,099 | A | * | 3/1997 | Stevens et al. ............. 438/626 |
| 5,912,188 | A | | 6/1999 | Gardner et al. |
| 2002/0024119 | A1 | | 2/2002 | Tanaka et al. |
| 2002/0145179 | A1 | | 10/2002 | Lam et al. |
| 2004/0063270 | A1 | | 4/2004 | Ishikawa |
| 2005/0110153 | A1 | | 5/2005 | Wu et al. |
| 2006/0009031 | A1 | * | 1/2006 | Kloster et al. ............. 438/637 |
| 2006/0102586 | A1 | | 5/2006 | Lee et al. |
| 2006/0110912 | A1 | | 5/2006 | Lu et al. |
| 2007/0161131 | A1 | * | 7/2007 | Shim .......................... 438/14 |
| 2007/0202676 | A1 | * | 8/2007 | Yeh et al. ................... 438/597 |
| 2009/0035902 | A1 | | 2/2009 | Xu et al. |
| 2009/0050984 | A1 | * | 2/2009 | Balasubramanian ....... 257/412 |

OTHER PUBLICATIONS

Wikipedia, The Free Enclyclopedia, http://en.wikipedia.org/wiki/Titanium_nitride ; 2 pages; 2014.*

* cited by examiner

*Primary Examiner* — Binh X Tran
(74) *Attorney, Agent, or Firm* — Slater & Matsil, L.L.P.

(57) ABSTRACT

A method for etching a layer assembly, the layer assembly including an intermediate layer sandwiched between an etch layer and a stop layer, the method including a step of etching the etch layer using a first etchant and a step of etching the intermediate layer using a second etchant. The first etchant includes a first etch selectivity of at least 5:1 with respect to the etch layer and the intermediate layer. The second etchant includes a second etch selectivity of at least 5:1 with respect to the intermediate layer and the stop layer. The first etchant being is different from the second etchant.

31 Claims, 4 Drawing Sheets

DEVICE AND METHOD FOR STOPPING ETCHING PROCESS

This application is a divisional of U.S. patent application Ser. No. 11/937,681, filed Nov. 9, 2007, now U.S. Pat. No. 8,404,597 which is incorporated herein by reference.

BACKGROUND

Embodiments of the present invention relate to a device and a method for stopping an etching process and, in particular, to increasing selectivity so that an etching process can be stopped securely.

Etching processes, in particular for thick layers comprising high non-uniformity as, for example, a variable layer thickness, usually require a very long over-etching process. In order to ensure secure stopping on a stop layer, often selectivities of more than 40:1 with regard to used materials of the layers to be etched and a stop layer are necessary. Both in front-end-of-line (FEOL) and also in back-end-of-line (BEOL) processes, this is difficult to realize and often additional problems make controlling the etching processes more difficult that arise as a consequence of high contamination.

SUMMARY OF THE INVENTION

Embodiments of the present invention refer to a method for etching a layer assembly, the layer assembly comprising an intermediate layer sandwiched between an etch layer and a stop layer, the method comprising a step of etching the etch layer using a first etchant and a step of etching the intermediate layer using a second etchant. The first etchant comprises a first etch selectivity of at least 5:1 with respect to the etch layer and the intermediate layer. The second etchant comprises a second etch selectivity of at least 5:1 with respect to the intermediate layer and the stop layer. The first etchant being different from the second etchant.

BRIEF DESCRIPTION OF THE DRAWINGS

Preferred embodiments of the present invention will be detailed subsequently referring to the appended drawings, in which.

Figure 1:
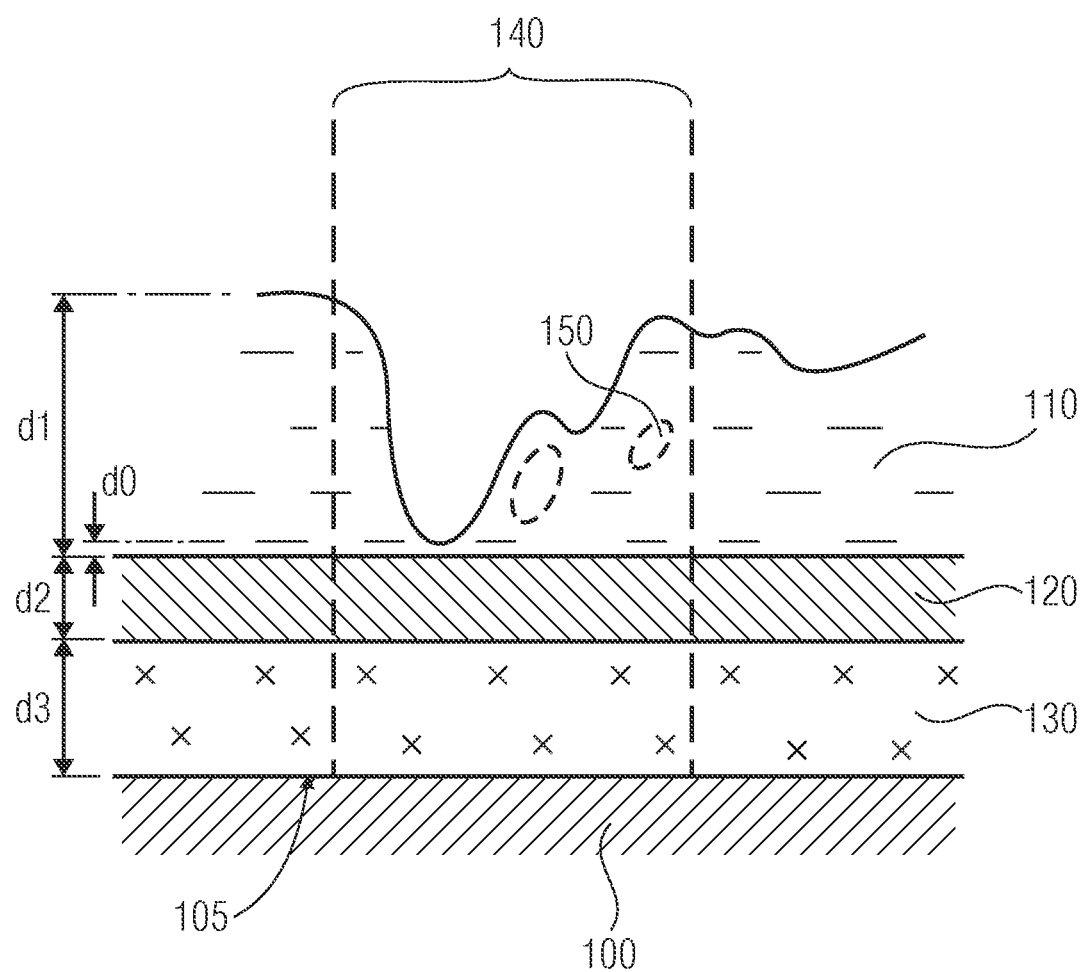
FIG. 1 shows a cross sectional view of a sequence of layers according to an embodiment of the present invention.

Before discussing embodiments of the present invention in greater detail below referring to the drawings, it is pointed out that same elements or elements having the same effect are provided with the same or similar reference numerals throughout the figures, and that a repeated description of these elements is omitted.

DETAILED DESCRIPTION OF ILLUSTRATIVE EMBODIMENTS

In modern manufacturing of devices, in particular using metal oxide semiconductor (MOS) technology, so-called via contacts are frequently formed. The via contacts usually make electrical contact between various layers thereby bridging an insulation layer (frequently an oxide layer) or another layer (e.g., a piezoelectric layer). In order to produce such a through contacting (by means of a via contact), the insulating layer is frequently etched in the contact region so that a corresponding recess or opening which typically ends on the layer to be contacted results. The layer to be contacted may exemplarily be a metal layer or a doped semiconductor region.

In order to ensure perfect functioning of the device to be processed, however, the contact layer should be exposed or open, but not be penetrated so that a hole appears and an underlying layer is exposed. The opening produced in the etching process consequently is not to etch through the contact layer, but instead is to stop on the contact layer (which is hence also denoted by a stop layer). In order to remove the insulating layer reliably, an over-etching can be performed, but in a way that the contact layer is not etched through. For this a corresponding etching process, comprising high selectivity with regard to the insulating layer and to the contact layer, is frequently used.

When manufacturing the devices, the insulating layer to be etched through (which is also denoted by etch layer) frequently comprises non-negligible inhomogeneities or non-uniformities. The non-uniformities on the one hand relate to a variable layer thickness since in a process of manufacturing the etch layer, it cannot always be ensured that the etch layer produced is of exactly the same layer thickness everywhere. In addition, non-uniformities relating to the material of the etch layer arise because there are frequently inclusions or impurities, air bubbles or contamination, for example. Consequently, the result is that a respective etching process cannot be performed with the same etching rate everywhere.

In principle, the non-uniformities can be taken into account by a stop layer (e.g., the above mentioned contact layer) comprising a bigger thickness and executing the etching process for a correspondingly long period of time. Thus, even in the worst case of a locally great layer thickness and/or local contamination (slowing down the etching process) it can be ensured that the etch layer will be removed completely by a correspondingly long over-etching process. The stop layer with a correspondingly great layer thickness, however, is generally technologically difficult or even impossible to realize. For example, when using titanium nitride (TiN) as a material for the stop layer, its layer thickness is limited in particular by the fact that corresponding stress (tension) between various layers is not to exceed a certain threshold value. As long as the titanium nitride is selected to be correspondingly thin, it will easily conform to the surrounding material (hardly any thermal stress, for example). Starting at a certain thickness, however, the titanium nitride will become dominant, the result being that the surrounding material may be subjected to intolerable stress. In addition, it is to be kept in mind that depositing titanium nitride causes considerable contamination in the device. Apart from titanium nitride, other materials can comprise layer thicknesses, which are severely limited (to limit stress, e.g.).

The only feasible way of ensuring secure stopping on the stop layer is choosing the etch selectivity of the etching process between etching the etch layer and etching the contacting layer (stop layer) to be as great as possible. Generally, a selectivity S is given by the ratio of the etching rate ER for an "a"-material and for a "b"-material as follows:

$$S_{(a:b)} = \frac{ER_a}{ER_b}$$

wherein the selectivity may be indicated as a ratio or as a number and the etching rate indicates the layer thickness $\Delta d$ etched per unit time $\Delta T$:

$$ER = \frac{\Delta d}{\Delta T}.$$

It has shown that a minimum selectivity of 40:1 should be guaranteed, more preferably a selectivity of more than 60:1 or roughly 100:1. Such high selectivities, however, are hardly known and/or selectivities in the range of 40:1 can only be achieved by entailing considerable expenditure by introducing new chemicals or developing new etching reactors. Conventional methods rely in part also on an adjustment of the integration scheme or the structure of the devices.

Embodiments of the present invention solve this problem by arranging between the etch layer and the stop layer an intermediate layer and executing two etching processes, one after the other. The intermediate layer is arranged or configured to act as a first stop layer for the first etching step and for the second etching step is processed in a way that it stops on the stop layer (contact layer). The selectivity is increased considerably since the selectivities with regard to the intermediate layer and with regard to the stop layer are multiplied. This may realize values exceeding 100:1.

Hence, embodiments comprise a method for etching a layer assembly, the layer assembly comprising an intermediate layer sandwiched between an etch layer (for example, layer to be etched) and a stop layer, the method comprising a step of etching the etch layer using a first etchant and a step of etching the intermediate layer using a second etchant. The first etchant comprising a selectivity with respect to the etch layer and the intermediate layer, wherein the first etchant being different from the second etchant.

Further embodiments also comprise a device for stopping the aforementioned etching process comprising an etch layer, which comprises a first material and an etch layer thickness, the intermediate layer, which comprises a second material and an intermediate layer thickness, and a stop layer. The intermediate layer thickness is such that a ratio of the etch layer thickness to the intermediate layer thickness is at most 3 times the etch selectivity of the first etching step. The first and second materials are such that the first etching step comprises the etch selectivity with respect to the first and second materials and comprise at least a ratio of 5:1.

In contrast to conventional methods, which rely on altered chemicals (such as, for example, etchants) or altered layer materials, the present invention is based on achieving two selectivities to be multiplied by performing two different etching steps, one after the other. To achieve this, the layer thickness of the intermediate layer is selected to be such that the first etching step, which removes the etch layer, can stop on the intermediate layer. Preferably, the intermediate layer is not etched through. In addition, the etching processes are preferably selected such that the first etching step comprises a high selectivity with regard to the materials of the etch layer and the intermediate layer. Similarly, it is preferred for the second etching step to be selected such that the second etching step, too, comprises a high selectivity with regard to the materials of the intermediate layer and the stop layer. Thus, the layer thickness of the intermediate layer on the one hand is dependant on the selectivity of the first etching process and, on the other hand, on the layer thickness of the etch layer. The layer thickness here should at least be selected such that generally the intermediate layer is not etched through in the first etching process.

Apart from a suitable selection of etching substances, the desired selectivities can be selected or optimized by the materials of the intermediate layer relative to the etch layer and relative to the stop layer in order to achieve the highest selectivity possible of the first and second etching processes. In addition, the material of the intermediate layer (for example, second material) can be chosen such that the stress to the etch layer and to the stop layer does not exceed a tolerable threshold (as small as possible while maintaining high selectivities).

Using conventional materials and, in particular, using a highly polymerizing chemistry, a selectivity of 20:1 can be achieved, for example, for oxide in the etch layer and titanium nitride in the etch layer. In order to ensure secure stopping on the exemplary titanium nitride layer, the consequence is that the titanium nitride layer should have such a thickness that about ½0th of the maximum layer thickness of the (non-uniform) etch layer can be consumed of the layer thickness of the titanium nitride layer. When, for example, the etch layer (oxide) has a layer thickness of approximately 600 nm, this means that the thickness of the titanium nitride layer should be sufficiently thick that approximately 30 nm of titanium nitride can be consumed without risk. Since titanium nitride layers or the etch layer frequently have a layer thickness of, for example, approximately 40 nm and thickening the titanium nitride layer (stop layer) as described before is limited for reasons of process technology, the consequence is that secure manufacturing is not possible or cannot be ensured in connection with conventional product variations. However, when, using embodiments of the present invention, additionally a thin layer (acting as second stop layer) of exemplarily approximately 60 nm SiON (silicon oxy-nitride) is deposited between the titanium nitride layer and the oxide layer, the following values result:

Selectivity oxide ($SiO_2$) to SiON: approximately 10:1, and
Selectivity SiON to TiN: approximately 10:1 wherein these selectivities relate to different etching processes and the additional thin layer of, for example, silicon oxy-nitride is the intermediate layer. This means that a selectivity of 100:1 can be achieved for the whole etching process between the etch layer (oxide) and the stop layer (exemplarily titanium nitride). This allows secure control of non-uniformities, which may be present in the oxide layer. For the aforementioned example with a layer thickness of the oxide layer of approximately 600 nm a selectivity of 100:1 produces a titanium nitride removal of only 6 nm. This small removal in the titanium nitride layer, however, does not cause problems for the usual layer thicknesses of the titanium nitride layers. In particular, etching through, which is to be prevented absolutely, is generally ruled out.

Embodiments of the present invention may particularly be applied when openings, for example, for contact holes or contact trenches, are to be formed by an etching that should stop in a thin etch layer (stop layer). Furthermore, embodiments can be employed with particular advantage when a layer to be etched (etch layer) is highly non-uniform. The non-uniformities here may refer, on the one hand, to a variable layer thickness, which can vary between a minimum and a maximum value, and, on the other hand, to impurities, inclusions or contaminations that may be present.

In summary, embodiments are especially suited for stopping an etch process on a thin layer or on a layer whose thickness is limited and cannot exceed a threshold. The very high etch selectivity needed for this is realized in embodiments by an additional layer (the intermediate layer) arranged between the layer to be etched (etch layer) and the layer to be exposed (the stop layer).

FIG. 1 shows a cross sectional view of a sequence of layers according to an embodiment of the present invention. A substrate 100 comprising a main side 105 is shown onto which a sequence of layers of an etch layer 110 comprising a first material, a intermediate layer 120 comprising a second material and a stop layer 130 is deposited, wherein the stop layer 130 is arranged between the intermediate layer 120 and the substrate 100 and the intermediate layer 120 is arranged between the stop layer 130 and the etch layer 110.

The etch layer 110 has a variable layer thickness varying between a minimum value d0 and a maximum value d1 within an etching region 140. The thickness of the etch layer 110 varies more than 10% around a mean value. The etching region 140 marks the region above the substrate main side 105 where an opening is to be realized by means of an etching process to exemplarily form in it a contact to be able to contact the stop layer 130. The intermediate layer 120 comprises an intermediate layer thickness d2 and the stop layer 130 comprises a stop layer thickness d3.

Additionally, the etch layer 110 comprises an inhomogeneous (non-uniform) structure so that inclusions or impurities 150 may be present apart from a variable layer thickness. The impurities 150 and the variable layer thickness of the etch layer 110 thus cause an etching process for opening the etch layer 110 to be inhomogeneous along the etching region 140, wherein, on the one hand, regions of smaller layer thicknesses can be etched faster than regions of thicker layer thicknesses and, on the other hand, impurities 150 which may be present may either slow down or accelerate the etching process. Accelerating the etching process may, for example, be caused by the impurities 150 exemplarily containing a material (for example air) etching faster than the material of the etch layer 110 (first material). Slowing down the etching process may, for example, be caused by the impurities 150 containing a material etching slower than the material of the etch layer 110.

Figure 2:
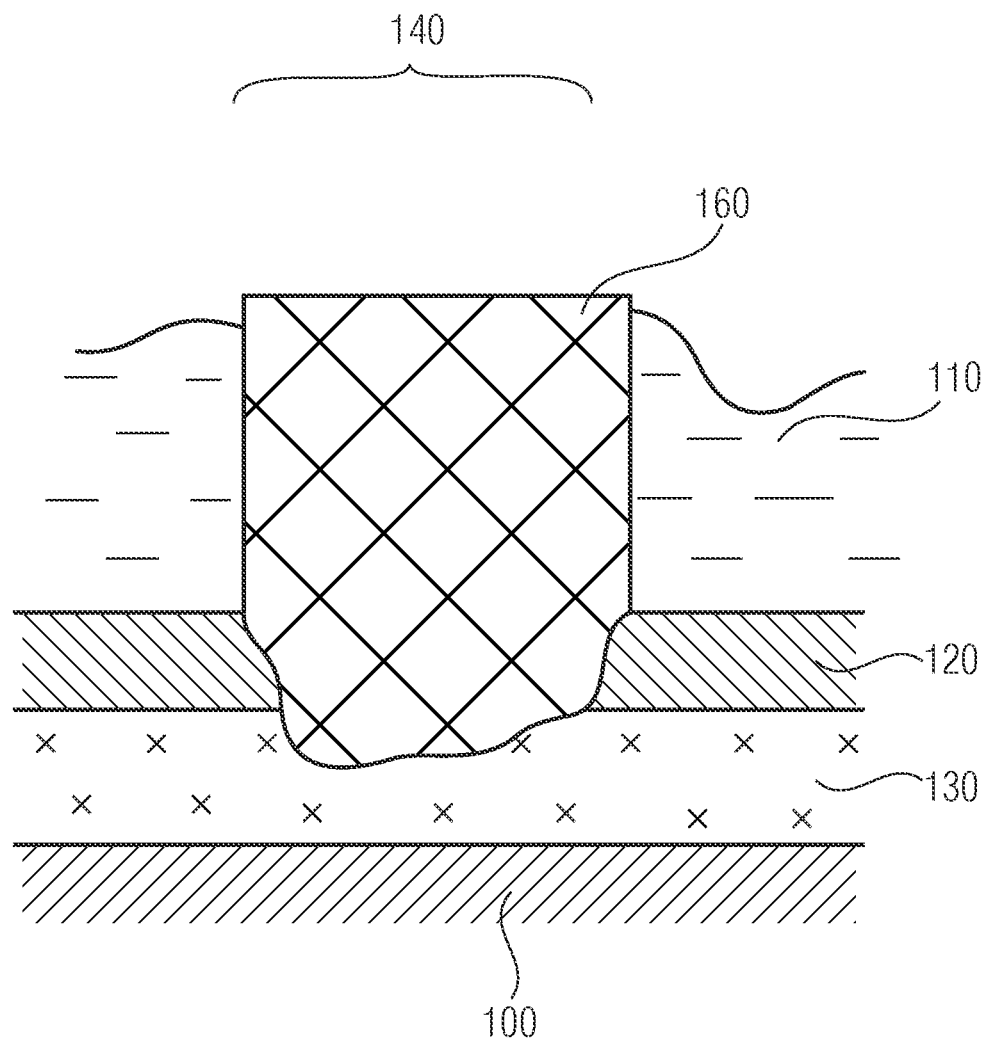
FIG. 2 shows a cross sectional view of a via-contact formed in an etching opening.

FIG. 2 shows a cross sectional view of a via contact 160 formed along the opened etching region 140. The via contact 160 can, for example, be realized by first opening the etching region 140 by an etching process and subsequently filling it with a material. The material may, for example, comprise a conductive material. FIG. 2 shows that it is important when forming the via contact 160 for the via contact 160 to stop in the stop layer 130, but does not make contact to the underlying substrate 100. The underlying substrate 100 may, for example, comprise aluminum and a direct contact of the via contact 160 to the substrate 100 may influence the mode of functioning of a finished processed device (wherein proper functioning is frequently no longer guaranteed when the stop layer 130 is penetrated).

Since, as mentioned above, the stop layer 130 can be a contact layer which exemplarily comprises titanium nitride and the layer thickness d3 of which should only be altered to a limited extent, it is important to make the etching process such that the highest effective selectivity possible with regard to the first material of the etch layer 110 and the second material of the stop layer 130 is realized. The intermediate layer 120 has been arranged between the etch layer 110 and the stop layer 130, which already slows down the etching process when opening along the etching region 140. A second etching process with the high selectivity with regard to the materials of the intermediate and stop layer 120, 130 finishes the etching process and thus contacting of the stop layer 130. The high selectivity comprises a ratio of at least 5:1 or better more than 10:1.

Figure 3A:
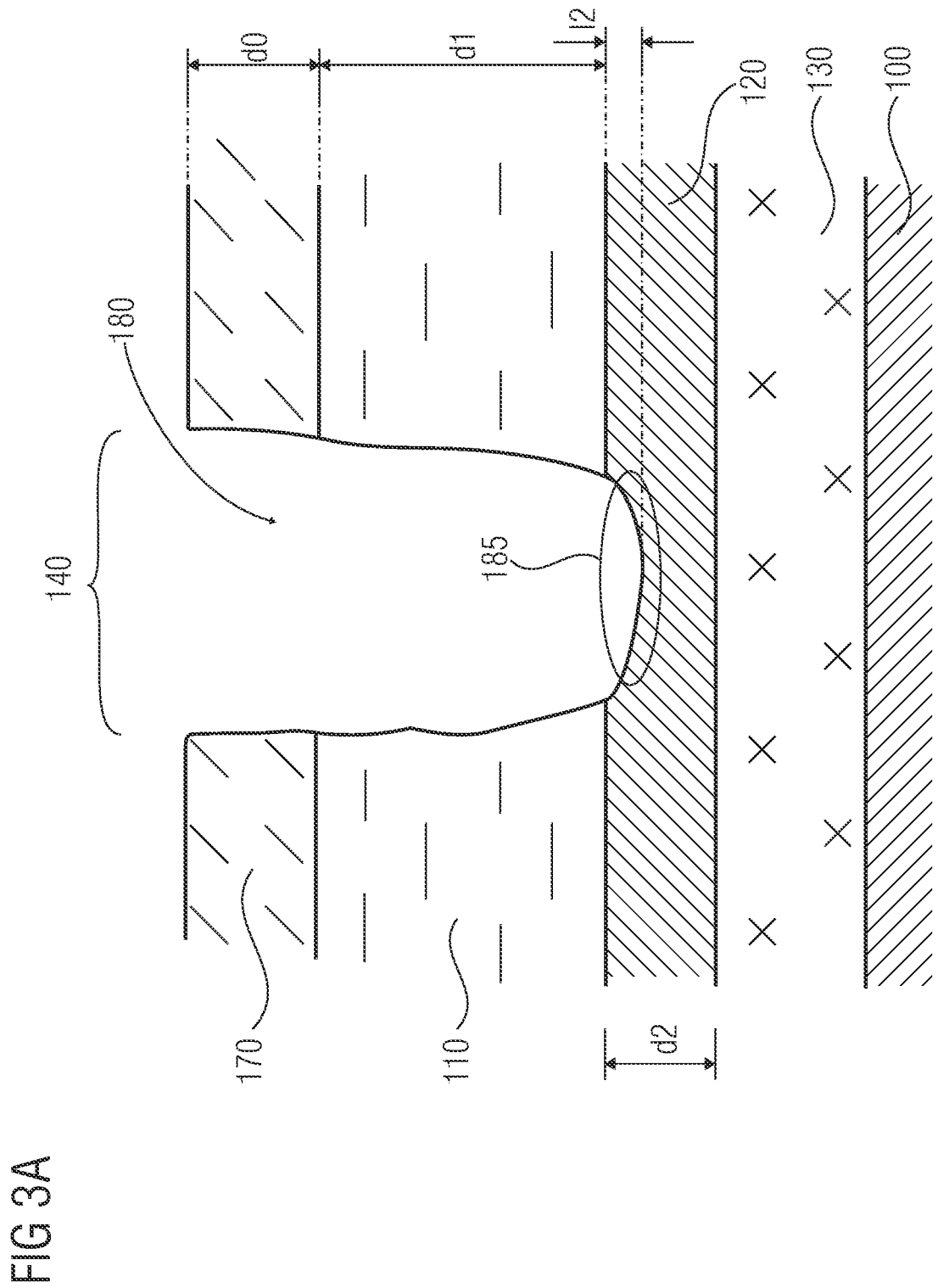
FIGS. 3A, 3B show schematic illustrations of a process sequence in two subsequent etching steps.
Figure 3B:
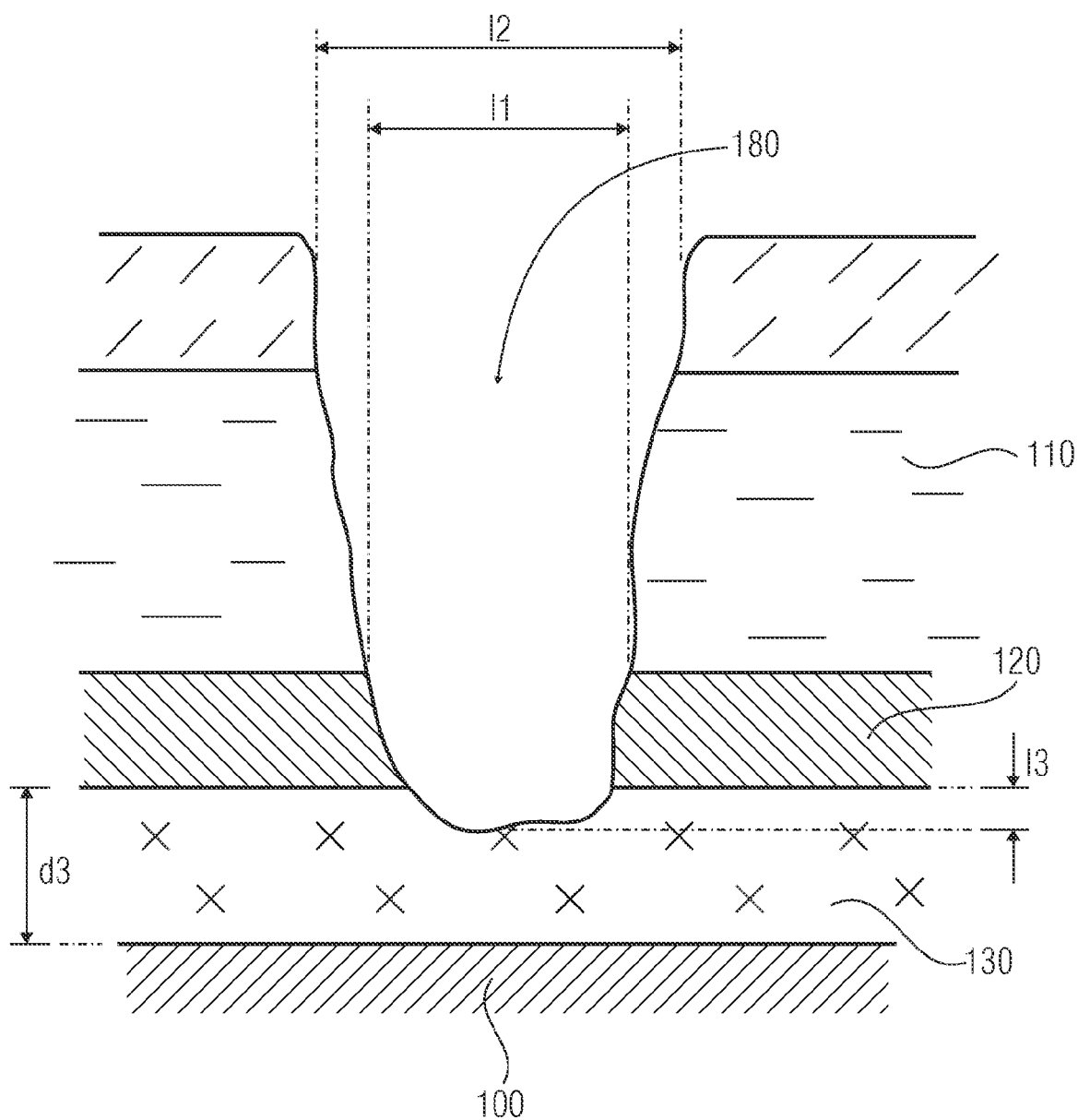

FIGS. 3A and 3B illustrate the two etching steps, which are performed one after the other.

FIG. 3A shows how at first the etch layer 110 is opened along the etching region 140 in a first step. At first, a mask 170 comprising a layer thickness d4 defining the etching region 140 is deposited on the etch layer 110 so that a subsequent etching process etches the etch layer 110 in the direction of the substrate 100 along the etching region 140, resulting in an opening 180. The etching process here is implemented such that the etch layer thickness d1 is removed in the first etching process as completely as possible in the etching region 140, and that additionally the intermediate layer 120 is etched to a first etching depth 12. How far the intermediate layer 120 is etched (for example, value of 12) in this first etching process depends on the non-uniformities of the etch layer 110. The resulting opening 180 generally comprises a non-planar base region 185. Regions where the etch layer 110 etches faster exhibit a greater penetration depth in the intermediate layer 120 than regions where the etch layer 110 etches slower, for example, where the etch layer 110 comprises a greater layer thickness. In order to ensure that the etch layer 110 is removed by etching as completely as possible, etching can be performed until the maximum etch layer thickness d1 has been removed by etching with a first etching rate $S_1$ of the first etching step.

The first etching process may, for example, be performed as follows. The etch layer thickness d1 of the etch layer 110 may, for example, be within a range between about 400 nm and about 700 nm or approximately 480 nm, the layer thickness d4 of the mask layer 170 may comprise a layer thickness between about 200 nm and about 300 nm or approximately 266 nm and the first etching depth 12 in the intermediate layer 120 may exemplarily comprise approximately 24 nm. The etch layer 110 may exemplarily comprise an oxide and the intermediate layer 120 may exemplarily comprise silicon oxy-nitride or nitride or another material. A possible etching rate for the oxide layer is about 6.5 nm/s and approximately 0.5 nm/s for the SiON layer. Thus, a selectivity between the etch layer 110 and the intermediate layer 120 is as follows:

$$S_1 = S_{(OX:SiON)} = \frac{ER_{OX}}{ER_{SiON}} \sim 13.$$

The first and second etching step, each may comprise further sub-etching processes and a main etching process. The main etching process of the first etching step may exemplarily comprise a duration of about 120 seconds has exemplarily etched through the etch layer 110 after approximately 74 seconds and has consumed, in the remaining approximately 46 seconds, further approximately 24 nm (first etching depth 12) of the intermediate layer 120. The first etching process may exemplarily comprise fluorocarbon (e.g., $C_5F_8$ or $C_4F_8$) as an etchant, which may exemplarily be combined with oxygen or argon and can achieve a selectivity with regard to the etch layer 110 and the intermediate layer 120 within a range of about 7:1 to about 17:1. The material of the etch layer 110 may exemplarily comprise oxide, but also nitride or oxy-nitride. The thicknesses of the layers and especially of the intermediate layer 120 (the thickness d2) depend on the selectivities of the first or second etching process.

These values are only examples and different values are also possible, wherein exemplarily the layer thickness of the etch layer 110 comprises an approximate value d1≈505 nm, the layer thickness of the mask layer d4≈248 nm and the etching rate of the oxide layer may exemplarily be approximately 6.28 nm/s and, for silicon oxy-nitride, approximately 0.63 nm/s so that the result is a selectivity $S_1$ of roughly 10. For these values, the etch layer 110 will be etched through after approximately 80 seconds and in the remaining approximately 40 seconds approximately 25 nm of the silicon oxy-nitride layer (intermediate layer 120) will be removed by etching. The layer thickness of the intermediate layer 120 may exemplarily be d2≈92 nm or approximately 97 nm and the layer thickness of the stop layer 130 may exemplarily be approximately 67 nm. The different values given here exemplarily result from variations of manufacturing devices at different locations of the wafer and, additionally, from the different intensity of the etching process taking place.

FIG. 3B illustrates the second etching process in which the intermediate layer 120 is etched through and the stop layer 130 is exposed, however, without exposing the underlying substrate 100. Starting from the process step shown in FIG. 3A, in this second etching step a different etching material which is particularly selective with regard to the material of the intermediate layer 120 as compared to the material of the stop layer 130 is used. As described in FIG. 3A, in the second etching process, too, the material of the intermediate layer 120 is removed within the etching region 140 by etching as much as possible. Thus, the stop layer 130 can be exposed, generally by over-etching so that the opening 180 also extends in the stop layer 130 to a second etching depth 13. In order not to open or expose the underlying substrate 100 in the etching process, the second etching step is selected such that 13 is smaller than d3 (layer thickness of the stop layer 130).

Generally, the etching process is performed such that the resulting opening 180 comprises different lateral extensions, the opening 180 may, for example, have a first extension 11 in the lower region and an extension 12 in the upper region of the opening 180. In the embodiment shown in FIG. 3B, 11 is smaller than 12, whereas 11 being bigger than a predetermined minimum extension so that the stop layer 130 can be contacted by the via contact 160 (not shown in FIG. 3b, see FIG. 2) to a sufficient extent and to enable a low-ohmic connection to the stop layer 130. In a subsequent process step, the opening 180 can be filled with conductive material in order to form the via contact 160 so that the sequence of layers as shown in FIG. 2 results.

The first lateral extension 11 of the contact opening 180 may, exemplarily, comprise a length between about 250 nm and about 300 nm or of approximately 279 nm or approximately 280 nm, and the second lateral extension 12 may exemplarily comprise a value between about 300 nm and about 350 nm or of approximately 328 nm or approximately 331 nm.

The second etching step can use, for example, a fluoromethan (e.g., $CHF_3$) as etchant. The selectivity $S_2$ of the second etching process with regard to the intermediate layer 120 and the stop layer 130 (exemplarily SiON:TiN) may exemplarily have a value of:

$$S_2 = S_{(SiON:TiN)} = \frac{ER_{SiON}}{ER_{TiN}} \sim 12.$$

The second etching process may exemplarily be performed as follows. At first, an oxygen flash or another intermediate process is performed to remove possible polymers having remained after the first etching process from the opening 180. The oxygen flash may exemplarily have a duration between about 5 s and about 20 s or of about 10 s. Subsequently, the main etching process for the second etching step having a duration of exemplarily approximately 95 seconds can be performed. The second penetration depth 13 may, for example, have a value of approximately 27 nm so that, for an exemplary etching time of about 95 seconds, an etching rate of approximately 0.28 nm/s results for etching the stop layer 130 (exemplarily titanium nitride). The second etching depth 13 of approximately 27 nm may, for example, refer to a case in which the intermediate layer 120 has been etched through completely in the first etching step so that the second etching step only deepens the opening 180 to the second etching depth 13. However, as a consequence of the non-uniformities of the etch layer 110, after the first etching step, the base region 185 will also be inhomogeneous. Consequently, the intermediate layer 120 after the first etching step will exhibit a varying layer thickness, which is etched in the second etching step.

With regard to the overall etching process (first etching process followed by second etching process), the following selectivity S results for the embodiment described here:

$$S = S_1 * S_2 \sim 156.$$

It is possible for the intermediate layer 120 to be etched through in the first etching step, but generally it is practical to select the intermediate layer thickness d2 of the intermediate layer 120 such that the first etching step will etch intermediate layer 120 only to a first etching depth 12<d2. By selecting the intermediate layer thickness d2 correspondingly, this can usually always be achieved since the etching rate of a certain material is given by:

$$ER = \frac{\Delta d}{\Delta T},$$

Δd referring to an etched layer thickness of a respective material and ΔT referring to the etching time. Since additionally the selectivity S of a first material to a second material and the ratio of the etching rate of the first material to the etching rate of the second material are given, the minimum layer thickness of the intermediate layer 120 can be estimated by the first selectivity $S_1$. The following relation results:

$$\frac{d1}{d2} < S_1.$$

The intermediate layer thickness of the intermediate layer 120 is to be selected to have at least a value of $d2 > d1/S_1$. Since etching through the intermediate layer 120 generally does not have to be ruled out, the intermediate layer thickness d2 of the intermediate layer 120 can also be selected such that the ratio of d1 to d2 is smaller than a multiple of the first selectivity $S_1$ so that $d1/d2 < \lambda * S_1$, wherein the factor may exemplarily be $\lambda = 2$ or $\lambda = 3$.

In further embodiments, the layer thicknesses comprise the following values. The etch layer thickness d1 of the etch layer 110 may exemplarily comprise a value of about 600 nm, the intermediate layer thickness d2 of the intermediate layer 120 may exemplarily be about 20-30 nm and the layer thickness d3 of the stop layer 130 may exemplarily be approximately 40 nm, so that secure stopping of the etching process (comprising the first and second etching steps) on the stop layer 130 is allowed by the selectivities and etching rates mentioned before. The values for the layer thicknesses mentioned and also those for the etching rates and selectivities, however, can be chosen to be different in other embodiments. The layer thicknesses and materials are, however, be selected, in correspondence with embodiments of the present invention, such that a selectivity S with regard to the etch layer 110 to the stop layer 130 ($S = S_1 \times S_2$) of at least about 1:40 or preferably more than 1:80 will result.

Thus, embodiments of the present invention are of particular advantage in that they allow secure stopping on a stop layer 130 even if the etch layer 110 is inhomogeneous. Examples of the etch layer 110 include oxide layers, which are frequently etched through in CMOS structures, to produce via-contacts between different levels or metallizations, for example. Thus, the reliability of the devices processed in this way can be increased considerably since etching through the stop layer 130 can be avoided (which generally results in malfunctioning of the device processed). This is of particular importance when the layer where the etching process is to stop (stop layer 130) cannot be enlarged for process regions, i.e., when a thin layer is to be stopped on. The additional layer (intermediate layer 120) at first slows down the etching process performed and at the same time increases selectivity with regard to the etch layer 110 to the stop layer 130.

Further embodiments comprise for the layer arrangement etch layer, intermediate layer, stop layer the following sequences of materials:

silicon nitride (SiN)-silicon oxide ($SiO_2$)-silicon (crystalline of poly crystalline);
silicon-silicon nitride-silicon oxide;
silicon oxide-silicon nitride-silicon, wherein the first material relates to the etch layer, the second material to the intermediate layer and the last material to the stop layer.

What is claimed is:

1. A method for etching a layer assembly comprising an intermediate layer sandwiched between an etch layer and a stop layer, the method comprising:
   in a region for forming a via contact to a contact portion of the stop layer, etching the etch layer using a first etchant, the etch layer comprising a first material and the first etchant comprising a first etch selectivity with respect to the etch layer and the intermediate layer; and
   etching the intermediate layer using a second etchant, the second etchant comprising a second etch selectivity with respect to the intermediate layer and the stop layer, wherein the second etchant is different from the first etchant, wherein the etch layer has a planar lower surface adjacent the intermediate layer and a non-planar upper surface over the contact portion of the stop layer, and wherein a thickness of the etch layer overlying the contact portion of the stop layer varies more than 10% around a mean value, wherein the etch layer has a variable thickness in the region to be etched for forming the via contact, and wherein the thickness is measured from the planar lower surface to the non-planar upper surface.

2. The method of claim 1, wherein the etch layer comprises an inclusion, and wherein the inclusion has an etching rate different than the etching rate of the first material.

3. The method of claim 1, wherein a thickness of the intermediate layer is such that a ratio of a thickness of the etch layer to the thickness of the intermediate layer is at most 3 times a first etch selectivity for a fluorocarbon etchant between the first material and a second material of the intermediate layer.

4. The method of claim 1, wherein the first etch selectivity comprises a ratio of at least 5:1 and wherein the second etch selectivity comprises a ratio of at least 5:1.

5. The method of claim 1, wherein the stop layer comprises a stop layer thickness and the step of etching the intermediate layer is performed such that the stop layer is opened to a depth, the depth comprising less than 50% of the stop layer thickness.

6. The method of claim 1, further comprising performing an oxygen flash to remove polymers within an etching area.

7. The method of claim 1, wherein etching the etch layer comprises etching the etch layer such that a part of the stop layer is exposed.

8. The method of claim 1, wherein etching the etch layer comprises etching with a fluorocarbon.

9. The method of claim 1, wherein etching the intermediate layer comprises etching with fluoro-methane.

10. The method of claim 1, wherein the etch layer comprises an inclusion, and wherein the inclusion has an etching rate less than the etching rate of the first material.

11. The method of claim 1, wherein etching the etch layer comprises etching with a fluorocarbon etchant, wherein etching the intermediate layer comprises etching with a fluoro-methane etchant.

12. The method of claim 11, wherein the first etch selectivity using the fluorocarbon etchant comprises a ratio of at least 5:1 and wherein the second etch selectivity using the fluoro-methane comprises a ratio of at least 5:1.

13. The method of claim 12, wherein a thickness of the intermediate layer is such that a ratio of a thickness of the etch layer to the thickness of the intermediate layer is at most 3 times a first etch selectivity for the fluorocarbon etchant between the first material and a second material of the intermediate layer.

14. A method for manufacturing a semiconductor structure, the method comprising:
   forming a stop layer having a third material;
   forming an intermediate layer over the stop layer, the intermediate layer comprising a second material and having an intermediate layer thickness;
   forming an etch layer over the intermediate layer, the etch layer comprising a first material and having an etch layer thickness; and
   performing a first etching step with a first etch selectivity in a region for forming a via contact, the first etching step being performed using a fluorocarbon etchant;
   wherein a ratio of the etch layer thickness to the intermediate layer thickness is at most 3 times the etch selectivity of the first etching step;
   wherein the first and second materials are such that the first etch selectivity for the fluorocarbon etchant between the first and second materials is at least a ratio of 5:1;
   wherein the second and third materials are such that a second etch selectivity for a fluoro-methane etchant between the second and third materials is at least a ratio of 5:1;
   wherein the etch layer comprises an inclusion in a region to be etched for forming a via contact; and
   wherein the inclusion has an etching rate different than the etching rate of the first material when exposed to the fluorocarbon etchant.

15. The method of claim 14, wherein forming the intermediate layer comprises forming the intermediate layer such that the intermediate layer thickness exceeds the ratio of the etch layer thickness to the etch selectivity.

16. The method of claim 14, wherein the etching rate of the inclusion is greater than the etching rate of the first material when exposed to the fluorocarbon etchant.

17. The method of claim 14, wherein the etching rate of the inclusion is less than the etching rate of the first material when exposed to the fluorocarbon etchant.

18. A method of forming a semiconductor structure, the method comprising:
   forming a stop layer of a first material over a semiconductor substrate, the stop layer comprising a contact layer and having a stop layer thickness;

forming an intermediate layer of a second material over the stop layer, the intermediate layer having an intermediate layer thickness; and forming an etch layer of a third material over the intermediate layer, the etch layer having an etch layer thickness, forming a via contact in a region by etching the etch layer, the intermediate layer, and the stop layer, wherein, due to non-uniformities in the etch layer, an etching rate through the third material of the etch layer varies across the region to be etched for forming the via contact and wherein the non-uniformities comprise one or more of inclusions, impurities, air bubbles or contamination.

19. The method of claim 18, wherein the etching rate of the non-uniformities is greater than the etching rate of the third material when exposed to a fluorocarbon etchant.

20. The method of claim 18, the etching rate of the non-uniformities is less than the etching rate of the third material when exposed to a fluorocarbon etchant.

21. The method of claim 18, wherein the non-uniformities comprise air.

22. The method of claim 18, wherein the first material comprises titanium nitride, wherein the second material comprises silicon oxynitride, and wherein the third material comprises an oxide material.

23. The method of claim 18, wherein the etch layer comprises a first non-uniformity in a region to be etched for forming the via contact, and wherein the first non-uniformity extends substantially through the etch layer thickness.

24. The method of claim 23, further comprising a second non-uniformity in the region to be etched for forming the via contact, and wherein the second non-uniformity extends only partially through the etch layer thickness.

25. The method of claim 18, wherein the intermediate layer thickness is such that a ratio of the etch layer thickness to the intermediate layer thickness is at most 3 times a first etch selectivity, and wherein the first etch selectivity is the etching rate of the first material divided by an etching rate of the second material when exposed to a fluorocarbon etchant.

26. The method of claim 25, wherein the first and second materials are such that the first etch selectivity for the fluorocarbon etchant between the first and second materials is at least a ratio of 5:1, and wherein the second and third materials are such that a second etch selectivity for a fluoro-methane etchant between the second and third materials is at least a ratio of 5:1.

27. The method of claim 26, wherein a thickness of the intermediate layer is less than a product of the second etch selectivity and the etch layer thickness.

28. A method of forming a semiconductor structure, the method comprising:

forming a stop layer of a first material over a semiconductor substrate, the stop layer comprising a conductive layer and having a stop layer thickness;

forming an intermediate layer of a second material over the stop layer, the intermediate layer having an intermediate layer thickness; and forming an etch layer of a third material over the intermediate layer, the etch layer having an etch layer thickness, forming a via contact in a region by etching the etch layer, the intermediate layer, and the stop layer;

wherein the etch layer comprises an inclusion, wherein the inclusion has an etching rate different than the etching rate of the third material during the etching, and wherein a thickness of the etch layer varies more than 10% around a mean value, wherein the etch layer has a variable thickness in the region to be etched for forming the via contact, and wherein the thickness is measured from a planar lower surface of the etch layer to a non-planar upper surface of the etch layer; and wherein the etch layer comprises a first non-uniformity in a region to be etched for forming the via contact, wherein the first non-uniformity extends substantially through the etch layer thickness, wherein the etch layer further comprises a second non-uniformity in the region to be etched for forming the via contact, wherein the second non-uniformity extends only partially through the etch layer thickness, and wherein sidewalls of the first non-uniformity are non-uniform, and wherein a bottom surface of the first non-uniformity is non-uniform.

29. The method of claim 28, wherein a sidewall of the first non-uniformity intersects with a sidewall of the second non-uniformity.

30. The method of claim 28, wherein the inclusion is disposed under the intersecting sidewalls of the first and second non-uniformities.

31. The method of claim 28, wherein the etch layer has a minimum thickness at a bottom surface of the first non-uniformity.

\* \* \* \* \*